United States Patent
Kim

(10) Patent No.: US 9,425,169 B2
(45) Date of Patent: Aug. 23, 2016

(54) FLEXIBLE STACK PACKAGES HAVING WING PORTIONS

(71) Applicant: SK Hynix Inc., Icheon (KR)

(72) Inventor: Jong Hoon Kim, Suwon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/495,686

(22) Filed: Sep. 24, 2014

(65) Prior Publication Data
US 2015/0348942 A1    Dec. 3, 2015

(30) Foreign Application Priority Data

May 27, 2014 (KR) .................. 10-2014-0063833

(51) Int. Cl.
*H01L 23/48* (2006.01)
*H01L 25/065* (2006.01)

(52) U.S. Cl.
CPC ... *H01L 25/0657* (2013.01); *H01L 2224/48091* (2013.01); *H01L 2224/48092* (2013.01); *H01L 2224/48145* (2013.01); *H01L 2225/06506* (2013.01); *H01L 2225/06527* (2013.01)

(58) Field of Classification Search
CPC .......... H01L 25/0657; H01L 2225/06506; H01L 2225/06527; H01L 2224/32145
See application file for complete search history.

(56) References Cited

U.S. PATENT DOCUMENTS

| | | | |
|---|---|---|---|
| 6,027,958 A | 2/2000 | Vu et al. | |
| 6,225,689 B1 | 5/2001 | Moden et al. | |
| 6,255,840 B1 * | 7/2001 | Hembree | G01R 1/0483 324/756.05 |
| 7,759,167 B2 | 7/2010 | Vanfleteren et al. | |
| 9,082,763 B2 * | 7/2015 | Yu | H01L 24/05 |
| 2007/0222054 A1 * | 9/2007 | Hembree | H05K 3/4046 257/686 |
| 2008/0290492 A1 * | 11/2008 | Chung | H01L 23/3128 257/686 |

FOREIGN PATENT DOCUMENTS

KR    10-2010-0050975 A    5/2010

* cited by examiner

*Primary Examiner* — Reema Patel
*Assistant Examiner* — Syed Gheyas

(57) ABSTRACT

A flexible stack package includes a first package and a second package. Each of the first and second packages includes a flexible layer, a chip embedded in the flexible layer, and a contact portion disposed on the chip to penetrate the flexible layer and exposed at a surface of the flexible layer. Each of the first and second packages includes a fixing portion and a wing portion. A first adhesion part is disposed between the fixing portion of the first package and the fixing portion of the second package to combine the first package with the second package. A first stretchable interconnector electrically connects or couples the contact portion of the first package to the contact portion of the second package.

20 Claims, 8 Drawing Sheets

FLEXIBLE STACK PACKAGES HAVING WING PORTIONS

CROSS-REFERENCE TO RELATED APPLICATION

The present application claims priority under 35 U.S.C. 119(a) to Korean Application No. 10-2014-0063833, filed on May 27, 2014, in the Korean Intellectual Property Office, which is incorporated herein by reference in its entirety.

BACKGROUND

1. Technical Field

Embodiments of the present disclosure relate to electronic devices and, more particularly, to flexible stack packages having wing portions.

2. Related Art

Electronic devices employed in electronic systems may include various circuit elements, such as circuit elements integrated in and/or on a semiconductor substrate (e.g., referred to as a semiconductor chip or a semiconductor die). The semiconductor chip or the semiconductor die may be stacked on a package substrate to provide a semiconductor package. Semiconductor packages are widely employed in electronic systems, such as computers, mobile systems and/or data storage media. Recently, flexible stack packages, which are capable of bending or warping, are increasingly in demand for use in mobile systems and wearable systems. Many efforts have been attempted to build flexible stack packages.

SUMMARY

Various embodiments are directed to flexible stack packages, electronic systems including the same, and memory cards including the same.

According to some embodiments, a flexible stack package includes a first package and a second package. Each of the first and second packages includes a flexible layer, a chip embedded in the flexible layer, and a contact portion disposed on the chip to penetrate the flexible layer and exposed at a surface of the flexible layer. In addition, each of the first and second packages includes a fixing portion and a wing portion. A first adhesion part is disposed between the fixing portion of the first package and the fixing portion of the second package to combine the first package with the second package. A first stretchable interconnector electrically connects the contact portion of the first package to the contact portion of the second package.

According to further embodiments, a memory card includes a memory and a memory controller controlling an operation of the memory. The memory or the memory controller includes a first package and a second package. Each of the first and second packages includes a flexible layer, a chip embedded in the flexible layer, and a contact portion disposed on the chip to penetrate the flexible layer and exposed at a surface of the flexible layer. In addition, each of the first and second packages includes a fixing portion and a wing portion. A first adhesion part is disposed between the fixing portion of the first package and the fixing portion of the second package to combine the first package with the second package. A first stretchable interconnector electrically connects the contact portion of the first package to the contact portion of the second package.

According to further embodiments, an electronic system includes a memory and a controller coupled with the memory through a bus. The memory or the controller includes a first package and a second package. Each of the first and second packages includes a flexible layer, a chip embedded in the flexible layer, and a contact portion disposed on the chip to penetrate the flexible layer and exposed at a surface of the flexible layer. In addition, each of the first and second packages includes a fixing portion and a wing portion. A first adhesion part is disposed between the fixing portion of the first package and the fixing portion of the second package to combine the first package with the second package. A first stretchable interconnector electrically connects the contact portion of the first package to the contact portion of the second package.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

When an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments only and are not intended to limit the present disclosure.

When an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a similar fashion (e.g., "between" versus "directly between," "adjacent" versus "directly adjacent," "on" versus "directly on").

Semiconductor chips may be obtained by separating a semiconductor substrate or a wafer, where electronic circuits are integrated, into a plurality of pieces using a die sawing process. Semiconductor chips may correspond to memory chips or logic chips. Memory chips may include dynamic random access memory (DRAM) circuits, static random access memory (SRAM) circuits, flash memory circuits, magnetic random access memory (MRAM) circuits, resistive random access memory (ReRAM) circuits, ferroelectric random access memory (FeRAM) circuits or phase change random access memory (PcRAM) circuits, which are integrated on and/or in a semiconductor substrate. Logic chips may include logic circuits, which are integrated on and/or in a semiconductor substrate. In some cases, the term "semiconductor substrate" used herein may be construed as a semiconductor chip or a semiconductor die in which integrated circuits are formed.

FIGS. 1 to 4 illustrate a flexible stack package 10 according to an embodiment of the present disclosure.

Figure 1:
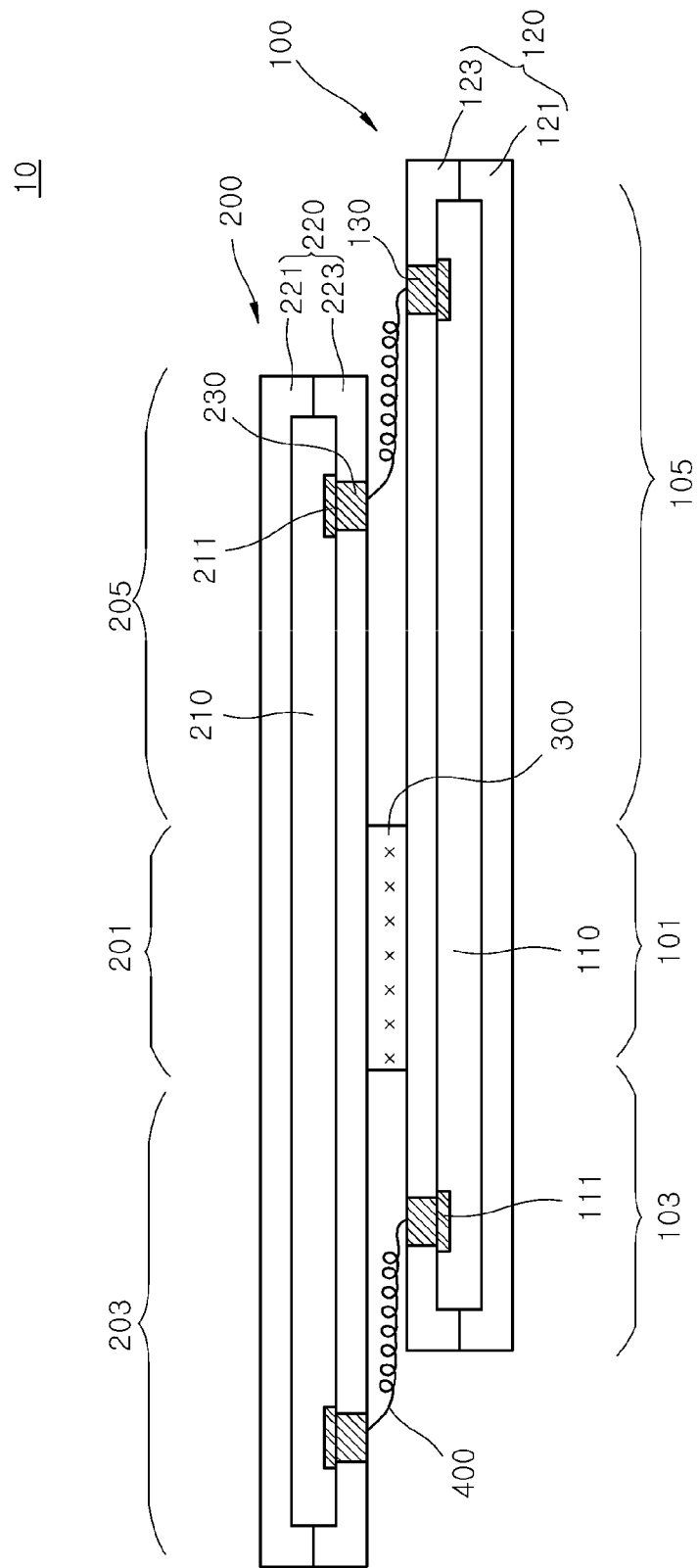
FIG. 1 is a cross-sectional view illustrating a flexible stack package according to an embodiment of the present disclosure.

Referring to FIG. 1, the flexible stack package 10 may include a pair of stacked flexible packages, including a first flexible package 100 and a second flexible package 200. Each of the flexible packages 100 and 200 may be called a sub-package or a unit package of the flexible stack package 10. Each of the flexible packages 100 and 200 may include a flexible layer 120 or 220 in which a semiconductor chip 110 or 210 is embedded.

Each of the semiconductor chips 110 and 210 may include a semiconductor substrate, such as a silicon substrate, and integrated circuits built in or on the semiconductor substrate. Each of the semiconductor chips 110 and 210 may have a certain thickness or other geometric parameter that enables the chips 110 and 210 to warp. For example, the semiconductor chips 110 and 210 may be formed having a thickness of about 30 micrometers or less by applying a polishing process (e.g., a back grinding process) to a back-side surface of the semiconductor substrate opposite to an active surface on which the integrated circuits are disposed. In some cases, if the thickness of the semiconductor chips 110 and 210 is greater than 30 micrometers, the semiconductor chips 110 and 210 may be broken or cracked, rather than warped, when a physically or mechanically bending force is applied to the semiconductor chips 110 and 210.

When the semiconductor chips 110 and 210 are warped or bent or otherwise deformed, a stress may be generated in the semiconductor chips 110 and 210. Each of the flexible layers 120 and 220 may include a lower flexible layer 121 or 221 and an upper flexible layer 123 or 223, between which the semiconductor chip 110 or 210 is disposed, providing a mechanical neutral plane that neutralizes, limits, minimizes, or reduces a mechanical force applied to the semiconductor chip 110 or 210 during a warping or bending of the semiconductor chip 110 or 210.

Connection terminals 111 or 211 may be disposed on a top surface of the semiconductor chip 110 or 210 to electrically connect or couple the integrated circuits in the semiconductor chip 110 or 210 to an external device. The top surface of the semiconductor chip 110 or 210 may be covered with the upper flexible layer 123 or 223, and a bottom surface of the semiconductor chip 110 or 210 may be covered with the lower flexible layer 121 or 221.

The lower flexible layers 121 and 221 and the upper flexible layers 123 and 223 may be formed with a flexible and/or elastic material. For example, the lower flexible layers 121 and 221 and the upper flexible layers 123 and 223 may be formed with a polymer material, a rubber material, and/or an elastomer material. Thus, the lower flexible layers 121 and 221 and the upper flexible layers 123 and 223 may be warped or bent, and may act as flexible films or flexible substrates that provide an elasticity or a flexibility to the flexible packages 100 and 200. In some embodiments, the lower flexible layers 121 and 221 and the upper flexible layers 123 and 223 may be formed of a flexible polymer film including a polyimide material.

For example, the flexibility or the elasticity of the flexible layer 120 or 220 may provide a mechanical neutral plane for the semiconductor chip 110 or 210 embedded in the flexible layer 120 or 220. Thus, a stress applied to the semiconductor chip 110 or 210 may be reduced or minimized, allowing the semiconductor chip 110 or 210 to warp or bend to a greater degree without causing the semiconductor chip 110 or 210 to break or crack under the applied stress.

Figure 4:
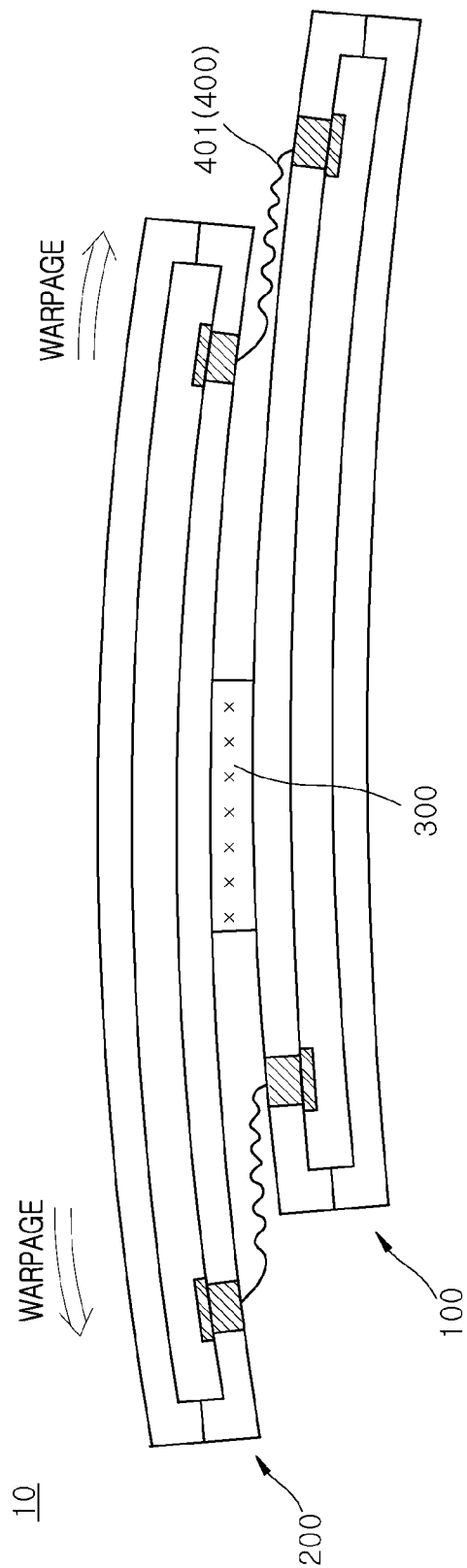
FIG. 4 is a cross-sectional view illustrating a warped shape of a flexible stack package according to an embodiment of the present disclosure.

Referring to FIGS. 1 and 4, when the flexible stack package 10 is warped into a convex shape, a tensile stress may be applied to an interface between the first upper flexible layer 123 and the first semiconductor chip 110, as well as to the first upper flexible layer 123. However, in such a case, the first upper flexible layer 123 may have an elastic restoring force that compensates for the applied tensile stress. Thus, the first upper flexible layer 123 may reduce the tensile stress, serving as a stress relieving or reducing layer. Also when the flexible stack package 10 is warped into a convex shape, a compressive stress may be applied to an interface between the first lower flexible layer 121 and the first semiconductor chip 110, as well as to the first lower flexible layer 121. However, in such a case, the first lower flexible layer 121 may have an elastic restoring force that compensates for the applied compressive stress. Thus, the first lower flexible layer 121 may reduce the compressive stress, serving as a stress relieving or reducing layer.

As such, when the flexible stack package 10 or the first semiconductor chip 110 is warped, the first flexible layer 120 may provide a force to counteract the stress applied to the first semiconductor chip 110, providing a mechanical neutral plane at the first semiconductor chip 110. As a result, the first flexible layer 120 may reduce the stress applied to the first semiconductor chip 110, preventing the first semiconductor chip 110 from being broken or cracked, even though the first semiconductor chip 110 is warped.

Referring again to FIG. 1, each of the flexible packages 100 and 200 of the flexible stack package 10 may include a fixing portion 101 (or 201) and wing portions 103 and 105 (or 203 and 205). The fixing portion 101 of the first flexible package 100 may be combined with and fixed to the fixing portion 201 of the second flexible package 200. The wing portions 103 and 105 of the first flexible package 100 may be located at both sides of the fixing portion 101 (e.g., opposite ends of the first flexible package 100), and may be referred to as first wing portions. Similarly, the wing portions 203 and 205 of the second flexible package 200 may be located at both sides of the fixing portion 201 (e.g., opposite ends of the second flexible package 200), and may be referred to as second wing portions. The first and second wing portions 103, 105, 203 and 205 may be flexible, such that they warp, bend, or move upwardly or downwardly (e.g., in response to an applied stress).

In another embodiment, each of the first and second flexible packages 100 and 200 may include a single fixing portion located at an edge thereof and a single wing portion located adjacent to the single fixing portion.

The first and second fixing portions 101 and 201 may be fixed to each other through a first adhesion part 300 to combine the first flexible package 100 with the second flexible package 200. Thus, the first adhesion part 300 may mechanically or fixedly combine the first fixing portion 101 of the first flexible package 100 with the second fixing portion 201 of the second flexible package 200. The first adhesion part 300 may include a dielectric adhesion material.

If the first and second fixing portions 101 and 201 are fixed to each other via the first adhesion part 300, spatial gaps may be provided between the first wing portion 103 and the second wing portion 203, as well as between the first wing portion 105 and the second wing portion 205. Thus, the first and second wing portions 103, 105, 203 and 205 may be freely bent or warped, and the flexible stack package 10 may be warped or bent at the first and second wing portions 103, 105, 203 and 205. A length of the first wing portion 103 (or, the second wing portion 203) may be equal to or different from a length of the first wing portion 105 (or the second wing portion 205), such as relative to a position of the fixing portion 101 (or 201).

Figure 2:
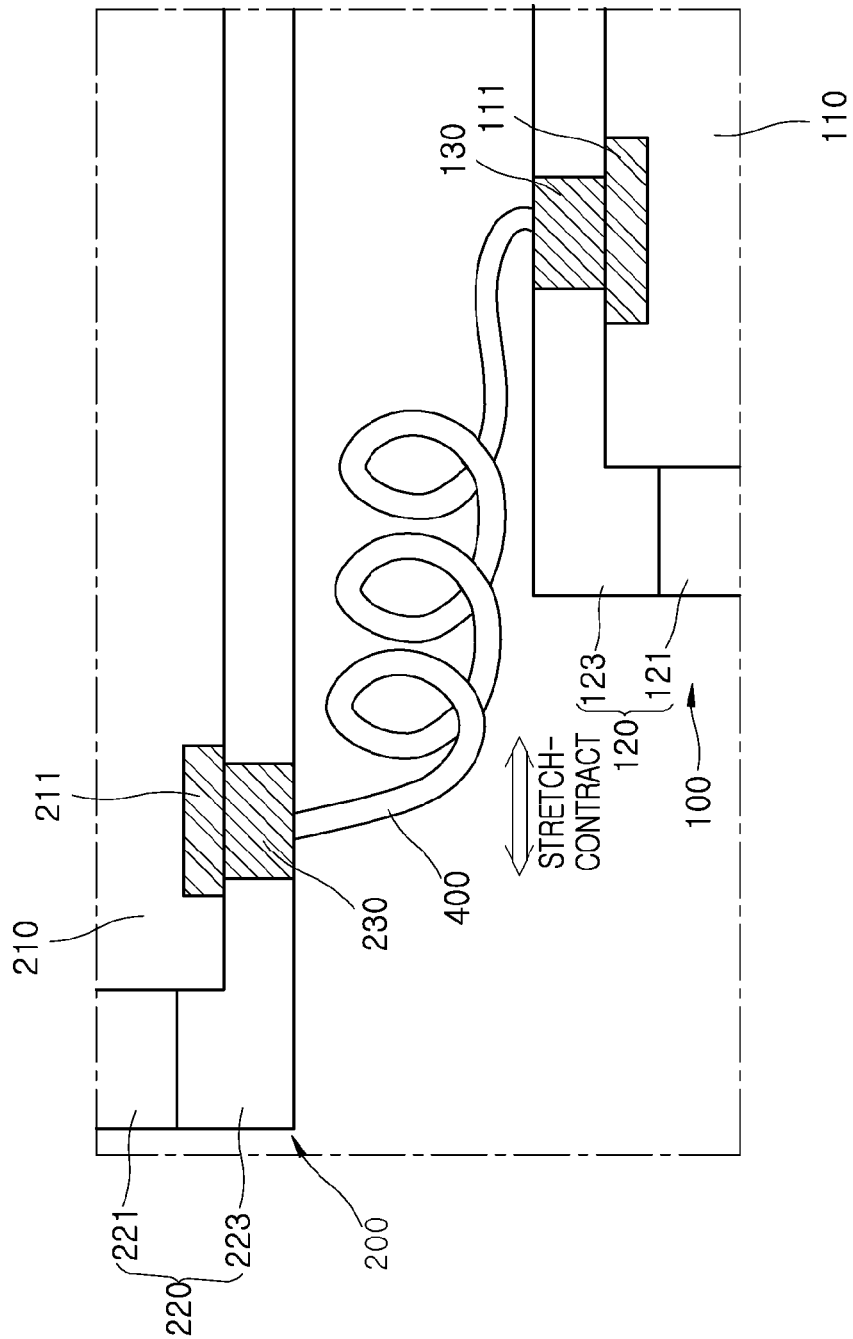
FIGS. 2 and 3 are schematic views illustrating a stretchable interconnector of a flexible stack package according to embodiments of the present disclosure.

Referring to FIGS. 1 and 2, contact portions 130 electrically coupled to the connection terminals 111 (e.g., pads) may be disposed on the first semiconductor chip 110, and contact portions 230 electrically coupled to the connection terminals 211 (e.g., pads) may be disposed on the second semiconductor chip 210. Thus, the contact portions 130 may be electrically coupled to the integrated circuits of the first semiconductor chip 110 through the connection terminals 111, and the contact portions 230 may be electrically coupled to the integrated circuits of the second semiconductor chip 210 through the connection terminals 211.

The contact portions 130 may be disposed on or within the first flexible layer 120, and may be exposed at a surface of the first flexible layer 120. Similarly, the contact portions 230 may be disposed on or within the second flexible layer 220, and may be exposed at a surface of the second flexible layer 220. The first contact portions 130 may be disposed in the first wing portions 103 and 105 of the first flexible package 100 within the first upper flexible layer 123, and the second contact portions 230 may be disposed in the second wing portions 203 and 205 of the second flexible package 200 within the second upper flexible layer 223. The first and second contact portions 130 and 230 may have a pad shape or a bump shape.

In some embodiments, first stretchable interconnectors 400 may electrically connect or couple the first contact portions 130 to the second contact portions 230. For example, first ends of the first stretchable interconnectors 400 may be coupled to respective ones of the first contact portions 130, and second ends of the first stretchable interconnectors 400 may be coupled to respective ones of the second contact portions 230. The first stretchable interconnectors 400 may have a spiral coil shape (e.g., a shape similar to the shape depicted in FIG. 2). However, the shape of the first stretchable interconnectors 400 is not limited to the spiral coil shape. Any conductive members that are extendable and shrinkable in length may be used as the first stretchable interconnectors 400. In another embodiment, wave-shaped conductive lines 401 may be employed as the first stretchable interconnectors 400, as illustrated in FIG. 4. All of the wave-shaped conductive lines 401 and the first stretchable interconnectors 400 having the spiral coil shape may be extendable and shrinkable in length, as described herein. When the flexible stack package 10 is warped or bent, as illustrated in FIG. 4, the wave-shaped conductive lines 401 or the first stretchable interconnectors 400 may extend or shrink in length to maintain electrical connections or couplings between the first contact portions 130 and the second contact portions 230.

Thus, when the first and second wing portions 103, 105, 203 and 205, including the first and second contact portions 130 and 230, are warped or otherwise deformed, electrical connection failures between the first and second flexible packages 100 and 200 may be prevented, because the first stretchable interconnectors 400 are flexible.

When the second flexible package 200 is stacked on the first flexible package 100, the second fixing portion 201 is vertically aligned with the first fixing portion 101, such that the second upper flexible layer 223 faces the first upper flexible layer 123. The first stretchable interconnectors 400 coupled to the first contact portions 130 may extend into the gaps between the first wing portions 103 and 105 and the second wing portions 203 and 205 to contact the second contact portions 230. As illustrated in FIG. 1, the second flexible package 200 may be laterally offset relative to the first flexible package 100, to provide a step structure between the first and second flexible packages 100 and 200.

Figure 3:
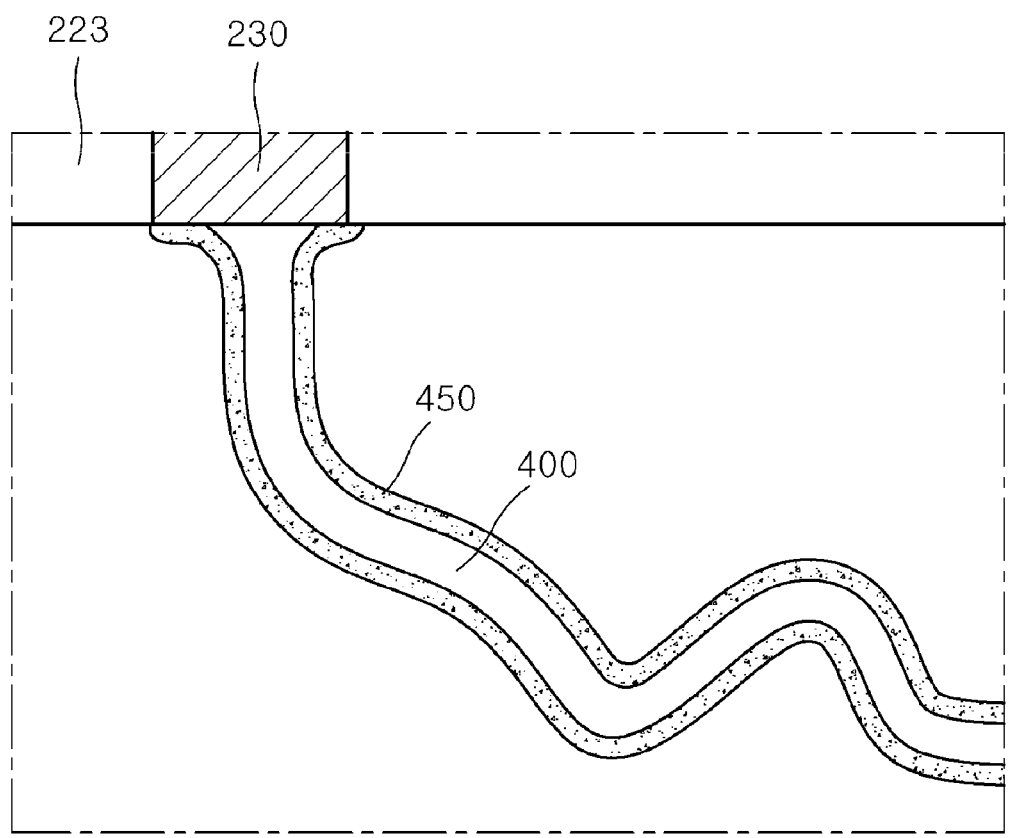

Referring to FIG. 3, the first stretchable interconnectors 400 may be coated with an insulation layer 450. The insulation layer 450 may be provided to electrically insulate the first stretchable interconnectors 400. The insulation layer 450 may include a flexible insulation material, such as a polymer material. The first stretchable interconnectors 400 may include a metal material, such as a gold material, an aluminum material, a copper material, or a combination thereof. The first stretchable interconnectors 400 may be formed using a wire bonding technique. The insulation layer 450 may be formed to cover the first stretchable interconnectors 400 by depositing a polymer material on the first stretchable interconnectors 400 using a spray process after the first stretchable interconnectors 400 are formed to electrically connect the first contact portions 130 to the second contact portions 230.

Figure 5:
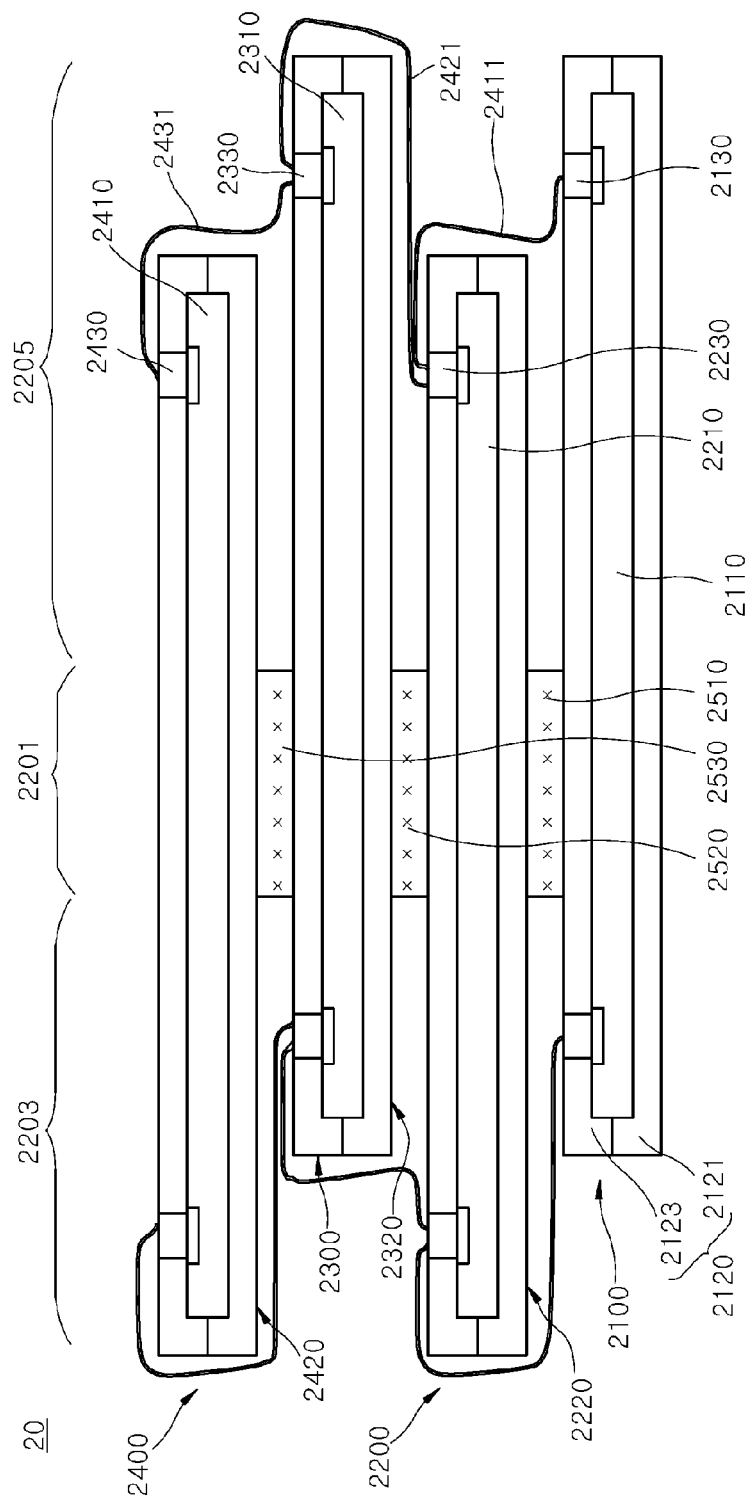
FIG. 5 is a cross-sectional view illustrating a flexible stack package according to an embodiment of the present disclosure.
Figure 6:
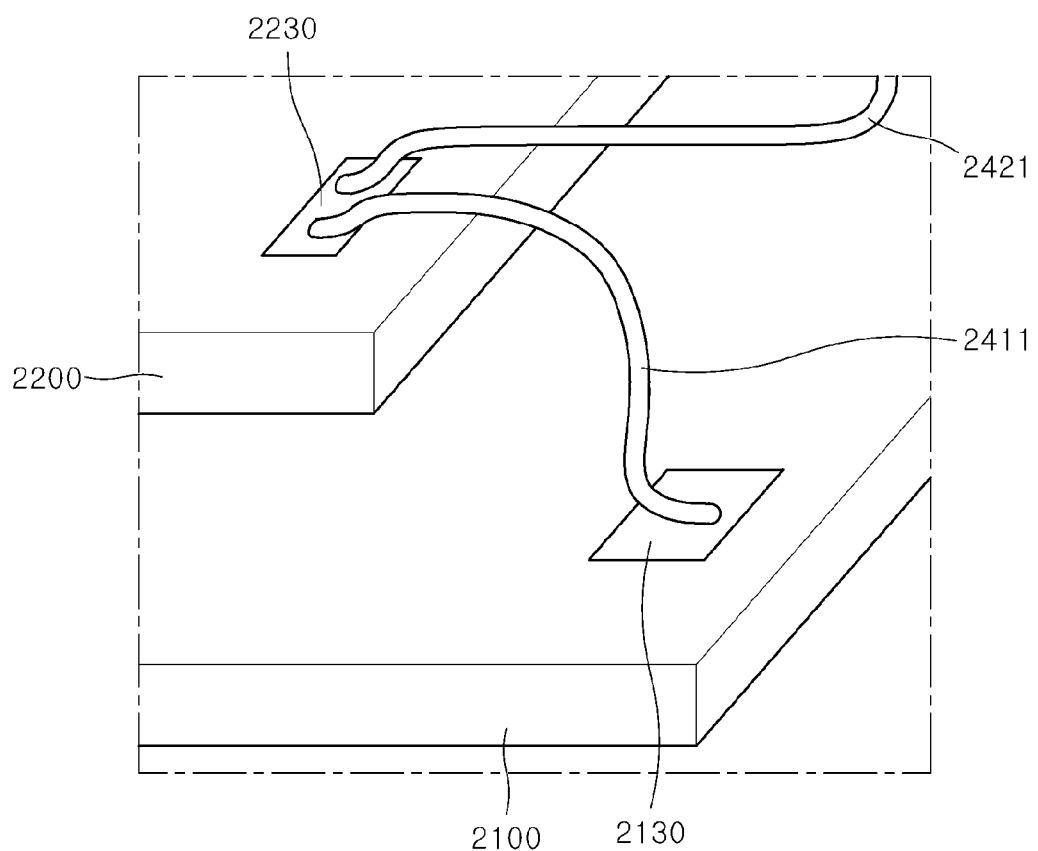
FIG. 6 is a perspective view illustrating a portion of the flexible stack package shown in FIG. 5.

FIG. 5 is a cross-sectional view illustrating a flexible stack package 20 according to an embodiment of the present disclosure, and FIG. 6 is a perspective view illustrating a portion of the flexible stack package 20 shown in FIG. 5.

Referring to FIG. 5, the flexible stack package 20 may include a first package 2100, a second package 2200, a third package 2300, and a fourth package 2400 The first package 2100 may include a first flexible layer 2120, a first semiconductor chip 2110 embedded in the first flexible layer 2120, and first contact portions 2130 disposed on the first semiconductor chip 2110 to penetrate the first flexible layer 2120. The first flexible layer 2120 may include an upper flexible layer 2123 covering an upper portion of the first semiconductor chip 2110 and a lower flexible layer 2121 covering a lower portion of the first semiconductor chip 2110.

The second package 2200 may include a second flexible layer 2220, a second semiconductor chip 2210 embedded in the second flexible layer 2220, and second contact portions 2230 disposed on the second semiconductor chip 2210 to penetrate the second flexible layer 2220.

The third package 2300 may include a third flexible layer 2320, a third semiconductor chip 2310 embedded in the third flexible layer 2320, and third contact portions 2330 disposed on the third semiconductor chip 2310 to penetrate the third flexible layer 2320.

The fourth package 2400 may include a fourth flexible layer 2420, a fourth semiconductor chip 2410 embedded in the fourth flexible layer 2420, and fourth contact portions 2430 disposed on the fourth semiconductor chip 2410 to penetrate the fourth flexible layer 2420. The packages 2100, 2200, 2300 and 2400 may be vertically stacked in a zigzag fashion to provide step structures between the packages 2100, 2200, 2300 and 2400. The packages 2100, 2200, 2300 and 2400 may include a fixing portion 2201 and a pair of wing portions 2203 and 2205 located at both sides of the fixing portion 2201. The fixing portions 2201 of the packages 2100, 2200, 2300 and 2400 may be disposed to vertically overlap with each other when adhesion parts 2510, 2520 and 2530 may be disposed between the fixing portions 2201 to fix the packages 2100, 2200, 2300 and 2400 to each other. Thus, the wing portions 2203 and 2205 of each of the packages 2100, 2200, 2300 and 2400 may be freely warped or bent.

The contact portions 2130, 2230, 2330 and 2430 may be disposed on top surfaces of contact terminals of the packages 2100, 2200, 2300 and 2400 and penetrate the flexible layers 2120, 2220, 2320, and 2420, respectively. Stretchable interconnectors 2411, 2421 and 2431, such as those described herein, may be provided to electrically couple the contact portions 2130, 2230, 2330 and 2430 to each other. The stretchable interconnectors 2411, 2421 and 2431 may be disposed along sidewalls of the wing portions 2203 and 2205 of the packages 2100, 2200, 2300 and 2400.

As illustrated in FIG. 6, the first stretchable interconnector 2411 may be disposed to electrically couple the first contact portion 2130 to the second contact portion 2230. One end of the first stretchable interconnector 2411 may be coupled to a first region of the second contact portion 2230, and one end of the second stretchable interconnector 2421 may be coupled to a second region of the second contact portion 2230 adjacent to the first region of the second contact portion 2230. Thus, the second stretchable interconnector 2421 may be electrically coupled to the first stretchable interconnector 2411 through the second contact portion 2230.

Figure 7:
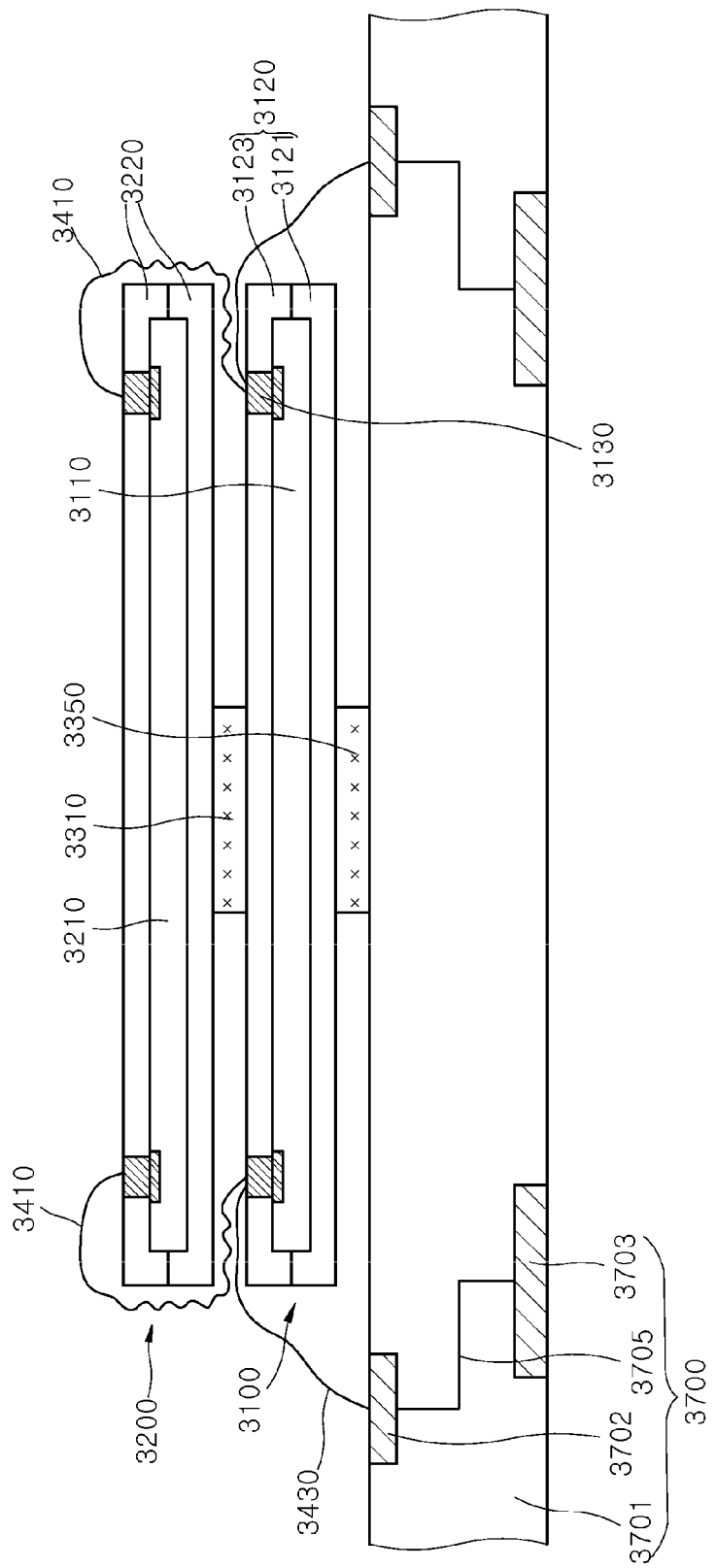
FIG. 7 is a cross-sectional view illustrating a flexible stack package according to an embodiment of the present disclosure.

FIG. 7 is a cross-sectional view illustrating a flexible stack package 30 according to an embodiment of the present disclosure.

Referring to FIG. 7, the flexible stack package 30 may include a first package 3100 and a second package 3200 stacked on the first package 3100. The first package 3100 may include a first flexible layer 3120 and a first semiconductor chip 3110 embedded in the first flexible layer 3120. The first flexible layer 3120 may include a lower flexible layer 3121 and an upper flexible layer 3123, and the first semiconductor chip 3110 may be disposed between the lower flexible layer 3121 and the upper flexible layer 3123. The second package 3200 may include a second flexible layer 3220 and a second semiconductor chip 3210 embedded in the second flexible layer 3220. Fixing portions of the first and second packages 3100 and 3200 may be combined with and fixed to each other by a first adhesion part 3310. The second package 3200 may be stacked on the first package 3100. Sidewalls of the second package 3200 may be vertically aligned with sidewalls of the first package 3100. First stretchable interconnectors 3410, such as those described herein, may be provided to electrically couple contact portions of the first package 3100 to contact portions of the second package 3200.

The first package 3100 may be attached and fixed to a top surface of a package substrate 3700 though a second adhesion part 3350. The first and second adhesion parts 3310 and 3350 may vertically overlap with each other such that the first adhesion part 3310 may adhere to one surface of the first package 3100 and the second adhesion part 3350 may adhere to another surface of the first package 3100 opposite to the first adhesion part 3310. Since the second adhesion part 3350 supports only the fixing portion of the first package 3100, wing portions of the first package 3100 may be freely warped or bent.

The package substrate 3700 may include a flexible substrate body 3701, first circuit interconnectors 3702 disposed on a top surface of the flexible substrate body 3701 and electrically coupled to the first and second packages 3100 and 3200 to act as landing pads, second circuit interconnectors 3703 disposed on a bottom surface of the flexible substrate body 3701, and connection lines 3705 disposed in the flexible substrate body 3701 to electrically couple the first circuit interconnectors 3702 to the second circuit interconnectors 3703. The substrate body 3701 may be a flexible material layer, such as a flexible film, to provide flexibility to the stack package 30. In some embodiments, the substrate body 3701 may be formed of a flexible polymer film including a polyimide material, or a laminated layer including a plurality of stacked dielectric material layers.

Second stretchable interconnectors 3430 may be provided to electrically couple the first circuit interconnectors 3702 of the package substrate 3700 to contact portions 3130 of the first package 3100. Thus, even though the package substrate 3700 or the first package 3100 is warped or bent, the first circuit interconnectors 3702 may maintain connections or couplings to the contact portions 3130 through the second stretchable interconnectors 3430, because the second stretchable interconnectors 3430 may be deformed (e.g., may be extended or shrinked). In some embodiments, the second stretchable interconnectors 3430 may have a spiral coil form or a wave form, as described herein.

As described herein, various embodiments provide flexible stack packages having a reduced thickness. According to the embodiments, a plurality of unit packages having flexibility may be stacked and electrically connected or coupled to each other without using bumps or solder balls disposed between the unit packages. Accordingly, a total thickness of a flexible stack package having a plurality of unit packages may be reduced.

Figure 8:
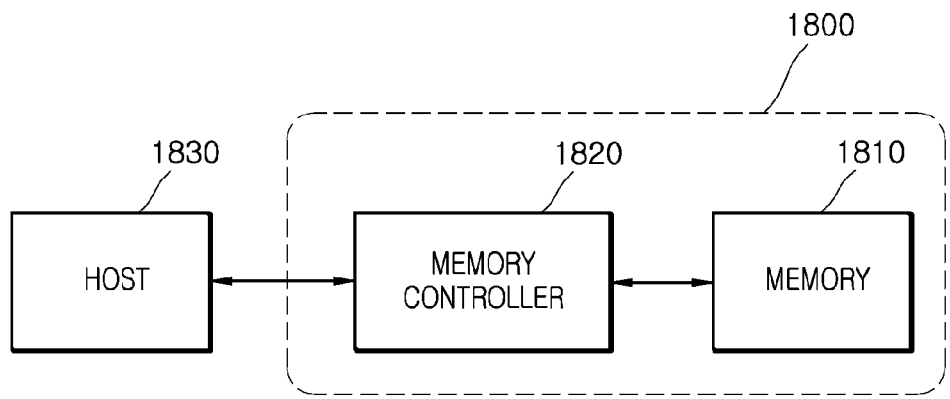
FIG. 8 is a block diagram illustrating an electronic system employing a memory card including a flexible stack package in accordance with some embodiments of the present disclosure.

FIG. 8 is a block diagram illustrating an electronic system employing a memory card 1800 including at least one flexible stack package according to an embodiment.

Referring to FIG. 8, the memory card 1800 may include a memory 1810, such as a nonvolatile memory device, and a memory controller 1820. At least one of the memory 1810 and the memory controller 1820 may include one or more flexible stack packages to which the technology of the embodiments is applied.

The memory 1810 may include a nonvolatile memory chip to which the technology of the embodiments is applied. The memory controller 1820 may control the memory 1810 such that data stored in the memory 1810 is read out or data is stored in the memory 1810, in response to a read/write request from a host 1830.

Figure 9:
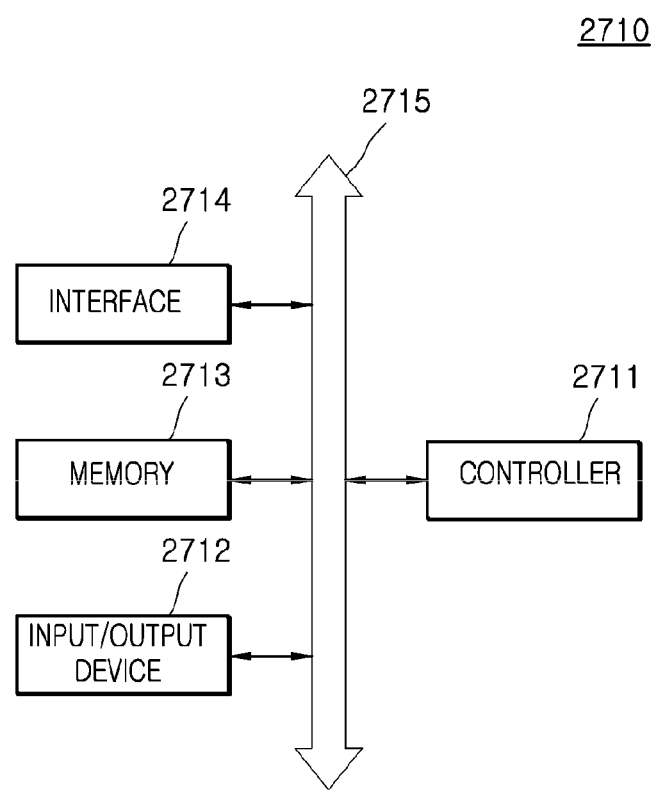
FIG. 9 is a block diagram illustrating an electronic system including a flexible stack package in accordance with some embodiments of the present disclosure.

FIG. 9 is a block diagram illustrating an electronic system 2710 including at least one flexible stack package according to some embodiments.

Referring to FIG. 9, the electronic system 2710 may include a controller 2711, an input/output device 2712, and a memory 2713. The controller 2711, the input/output device 2712 and the memory 2713 may be coupled with one another through a bus 2715 providing a path through which data move.

In some embodiments, the controller 2711 may include at least one of at least one microprocessor, at least one digital signal processor, at least one microcontroller, and logic devices capable of performing the same functions as these components. The controller 2711 or the memory 2713 may include at least one selected from the flexible stack packages according to the embodiments of the present disclosure. The input/output device 2712 may include at least one selected among a keypad, a keyboard, a display device, a touchscreen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in the flash memory.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. The mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

The embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A flexible stack package comprising:
  a first package and a second package, each of the packages including:
    a fixing portion;
    a wing portion; and
    a chip embedded in a flexible layer, the flexible layer exposing a contact portion disposed on the chip;
  a first adhesion part binding the fixing portion of the first package to the fixing portion of the second package without protruding into a first surface of the first package and a second surface of the second package, the first surface and the second surface facing each other; and
  a first stretchable interconnector electrically coupling the contact portion of the first package to the contact portion of the second package.

2. The flexible stack package of claim 1,
  wherein the first stretchable interconnector includes a conductive line having a spiral coil shape or a wave shape; and
  wherein one end of the conductive line is connected to the contact portion of the first package and the other end of the conductive line is connected to the contact portion of the second package.

3. The flexible stack package of claim 2, further comprising an insulation layer covering the conductive line.

4. The flexible stack package of claim 1, wherein the contact portions of the first and second packages are disposed in the wing portions of the first and second packages.

5. The flexible stack package of claim 4, wherein the second package is stacked over the first package such that the contact portion of the first package faces the contact portion of the second package.

6. The flexible stack package of claim 5, wherein the first stretchable interconnector is disposed in a gap between the wing portions of the first and second packages.

7. The flexible stack package of claim 4, wherein the second package is stacked over the first package such that the contact portions of the first and second packages face the same direction.

8. The flexible stack package of claim 7, wherein the first stretchable interconnector is disposed along a sidewall of the wing portion of the first package or along a sidewall of the wing portion of the second package.

9. The flexible stack package of claim 4, wherein the wing portion of each of the first and second packages includes first and second wing portions disposed at both sides of the fixing portion of each of the first and second packages.

10. The flexible stack package of claim 1, wherein the second package is stacked over the first package such that sidewalls of the second package are vertically aligned with sidewalls of the first package.

11. The flexible stack package of claim 1, wherein the second package is laterally offset relative to the first package to provide a step structure between the first and second packages.

12. The flexible stack package of claim 1, wherein each of the chips of the first and second packages has a thickness of about 30 micrometers or less.

13. The flexible stack package of claim 1,
  wherein each of the flexible layers of the first and second packages includes an upper flexible layer and a lower flexible layer; and
  wherein each of the chips of the first and second packages is disposed between the upper flexible layer and the lower flexible layer.

14. The flexible stack package of claim 1, wherein each of the flexible layers of the first and second packages includes a polymer material, a rubber material or an elastomer material.

15. The flexible stack package of claim 14, wherein each of the flexible layers includes a polyimide material.

16. The flexible stack package of claim 1, further comprising:
  a package substrate over which the first package is mounted; and
  a second adhesion part disposed between the fixing portion of the first package and a portion of the package substrate to fix the first package to the package substrate.

17. The flexible stack package of claim 16, further comprising:
  a second stretchable interconnector electrically coupling a circuit interconnector disposed on the package substrate to the contact portion of the first package.

18. The flexible stack package of claim 1, further comprising:
  a third package disposed over the second package opposite to the first package; and
  a third adhesion part disposed between the fixing portion of the second package and a fixing portion of the third package to fix the third package to the second package.

19. A memory card comprising:
a memory; and
a memory controller controlling an operation of the memory;
wherein the memory or the memory controller includes:
  a first package including:
    a flexible layer;
    a chip embedded in the flexible layer;
    a contact portion disposed on the chip, the contact portion exposed at a surface of the flexible layer;
    a fixing portion; and
    a wing portion;
  a second package including:
    a flexible layer;
    a chip embedded in the flexible layer;
    a contact portion disposed on the chip, the contact portion exposed at a surface of the flexible layer;
    a fixing portion; and
    a wing portion;
  a first adhesion part disposed between the fixing portion of the first package and the fixing portion of the second package to combine the first package with the second package without protruding into a first surface of the first package and a second surface of the second package, the first surface and the second surface facing each other; and
  a first stretchable interconnector electrically coupling the contact portion of the first package and the contact portion of the second package.

20. An electronic system comprising:
a memory; and
a controller coupled with the memory through a bus,
wherein the memory or the controller includes:
  a first package including:
    a flexible layer;
    a chip embedded in the flexible layer;
    a contact portion disposed on the chip, the contact portion exposed at a surface of the flexible layer a fixing portion; and
    a wing portion;
  a second package including:
    a flexible layer;
    a chip embedded in the flexible layer;
    a contact portion disposed on the chip, the contact portion exposed at a surface of the flexible layer;
    a fixing portion; and
    a wing portion;
  a first adhesion part disposed between the fixing portion of the first package and the fixing portion of the second package to combine the first package with the second package without protruding into a first surface of the first package and a second surface of the second package, the first surface and the second surface facing each other; and
  a first stretchable interconnector electrically coupling the contact portion of the first package and the contact portion of the second package.

* * * * *